(12) United States Patent
Boro et al.

(10) Patent No.: US 9,139,143 B2
(45) Date of Patent: Sep. 22, 2015

(54) ROBUST WIRES-TO-METER CONNECTION

(71) Applicant: Trail Tech, Inc., Battle Ground, WA (US)

(72) Inventors: Jonathan V. S. Boro, Battle Ground, WA (US); Geoffrey Wotton, Battle Ground, WA (US)

(73) Assignee: Trail Tech, Inc., Battle Ground, WA (US)

( * ) Notice: Subject to any disclaimer, the term of this patent is extended or adjusted under 35 U.S.C. 154(b) by 228 days.

(21) Appl. No.: 13/910,827

(22) Filed: Jun. 5, 2013

(65) Prior Publication Data

US 2014/0285981 A1    Sep. 25, 2014

Related U.S. Application Data

(60) Provisional application No. 61/804,162, filed on Mar. 21, 2013.

(51) Int. Cl.
*H05K 3/32*        (2006.01)
*H05K 1/14*        (2006.01)
*B60R 16/02*       (2006.01)

(52) U.S. Cl.
CPC ............ *B60R 16/0215* (2013.01); *H05K 1/147* (2013.01); *H05K 3/32* (2013.01); *Y10T 29/49169* (2015.01)

(58) Field of Classification Search
CPC ......... H05K 1/028; H05K 1/147; H05K 3/32; H01R 12/59; B60R 16/0215; B60R 16/02
See application file for complete search history.

(56) References Cited

U.S. PATENT DOCUMENTS

| | | | |
|---|---|---|---|
| 5,255,155 A * | 10/1993 | Sugimoto et al. | 361/749 |
| 6,512,677 B1 * | 1/2003 | Bergherr et al. | 361/752 |
| 2010/0128449 A1 * | 5/2010 | Mangaroo | 361/752 |
| 2011/0242618 A1 * | 10/2011 | Takeuchi et al. | 358/474 |
| 2013/0264107 A1 * | 10/2013 | Meyers | 174/268 |
| 2014/0165726 A1 * | 6/2014 | Boro et al. | 73/514.39 |
| 2015/0195927 A1 * | 7/2015 | Lee et al. | 361/749 |

* cited by examiner

*Primary Examiner* — Jeremy C Norris
*Assistant Examiner* — Nathan Milakovich
(74) *Attorney, Agent, or Firm* — Hancock Hughey LLP

(57) ABSTRACT

A robust and waterproof wires-to-meter connection that provides an apparatus for conducting signals from several signal-carrying, bundled wires to a circuit member that is mounted within the interior of a sealed case, and in particular an assembly for conducting the signals while providing a robust, compact and water-resistant connection between the internal main circuit and the entry wires.

13 Claims, 2 Drawing Sheets

ROBUST WIRES-TO-METER CONNECTION

BACKGROUND INFORMATION

This invention relates to a meter for motorcycles or the like, and in particular to an approach to connecting the individual wires of a wire bundle to an indicator dashboard or similar meter (hereafter collectively referred to as "dashboard") that is mounted to the motorcycle bar for displaying information (speed, temperature, etc.).

The wire bundle comprises several insulated wires that emanate from connections to detectors or sensors that are located on the vehicle away from the dashboard. The wires are bundled within a protective outer sheath. The end of the sheath enters the dashboard case and the individual wires are connected in some manner to the main circuit board of the dashboard.

FIG. 1 illustrates a prior art approach for connecting the individual wires of a wire bundle to an indicator dashboard. The case 1 of the dashboard is typically mounted in front of the motorcycle bar to enable easy viewing of the dashboard display by a rider.

A battery 6 is secured in a mounting in the case by a cover 7 and O-ring 5. The case 1 includes and interior 12 that houses the main circuit board and associated display components. FIG. 1 shows the bottom of the case housing 13 and a resilient seal 3 that fits between the housing and a case cover (not shown) that includes a transparent lens for viewing the display that is housed in the case.

A wire bundle 11 is enclosed in a protective sheath 10 and enters an opening in the back of the case 1. As shown in the exploded view of FIG. 1, the termini of these wires 11 (hereafter sometimes referred to as "entry" wires) are connected to the underside of an interface printed circuit board (PCB) 2. Near one edge of that PCB, the ends of several, smaller "internal" wires 15 are joined to the upper surface of the interface PCB 2. The internal wires 15 are bent to extend away from and generally parallel to the plane of the PCB. The outer ends of the internal wires 15 are crimped into a connector 14 that connects to the main circuit board (not shown) that is carried inside the case.

As part of the assembly process for this device, the PCB 2 is seated inside of a well 16 that is defined in the interior 12 of the case 1. The well 16 is a compartment that is defined by the back wall of the case and by four, inwardly projecting thin sidewalls 17 that define a cubical volume within which the PCB 2 is secured. The wire bundle 11 extends through the opening in the back wall of the meter case to protrude inside the well 16, for connection to the interface PCB as noted above. The well 16 is filled with epoxy for the purpose of providing strain relief and preventing water from migrating into the case.

The prior art assembly process for connecting the internal wires 15 between the upper surface of the interface PCB 2 and the main circuit board, as noted above, requires soldering of the ends of the wires 15 to the PCB and crimping the other ends of the wires into a connector that is in turn inserted into the mating connector carried on the main circuit board. To accomplish the insertion, and to facilitate handling of the wires 15 during assembly, the length of the wires between the PCB and connector 14 is made slightly longer than the distance between the wire ends at the PCB and the connector when finally assembled. Accordingly, each of the wires is necessarily bent slightly during and after assembly. Controlling the final configuration of the bends is difficult because each individual wire is free to buckle in any direction (upwardly, downwardly or sideways). Sideways buckling can be particularly troublesome because such a "stray" buckled wire can obstruct assembly or hinder connection of other components within the compact dashboard case. Thus, extra assembly time and cost is required to carefully control the buckling direction of all of the wires to avoid strays.

The prior art device is also susceptible to failure attributable to vibration and penetration of moisture into the case. In particular, the solder joints of the internal wires can be stressed by the continuous vibration occurring during operation of the motorcycle, and eventually separate from the PCB 2 at the location where the wire ends are soldered to the PCB. One way to address this problem is to reduce the mass of the wires (hence reduce the damaging energy transmitted via vibration) by using very small diameter wires. However, when wires are connected to the PCB using modern lead-free solders, the attendant higher melting points of such solders calls for relatively stiffer insulating jackets over the wire than is required with lead-based solders. The stiffer insulation in turn increases the overall mass of the wires, and thus returns the damaging vibration problem.

Finally, despite the presence of sealing epoxy in the well 16 mentioned above, some moisture may penetrate the well, and the presence of the internal wires that extend from the PCB in the well to the connector 14 on the main circuit board provide between the wires a capillary path for the moisture to flow to the connector 14 and damage the main circuit board. This capillary flow seems to be enhanced by the presence of an array of grooves 20 formed in the upper edge of the prior art sidewall 17 over which the internal wires 15 pass, each groove receiving a wire.

SUMMARY OF THE INVENTION

The invention disclosed here provides an apparatus for conducting signals from several signal-carrying, bundled wires to a circuit member that is mounted within the interior of a sealed case, and in particular an assembly for conducting the signals while providing a robust, compact and water-resistant connection between the internal main circuit and the entry wires.

Also provided is a robust method of conducting signals from several signal-carrying wires to a circuit member that is mounted within the interior of a sealed case.

Other advantages and features of the present invention will become clear upon study of the following portion of this specification and drawings.

BRIEF DESCRIPTION OF THE DRAWINGS

FIG. 2 shows the underside of a conductor assembly component of the present invention.

DETAILED DESCRIPTION

Figure 1:
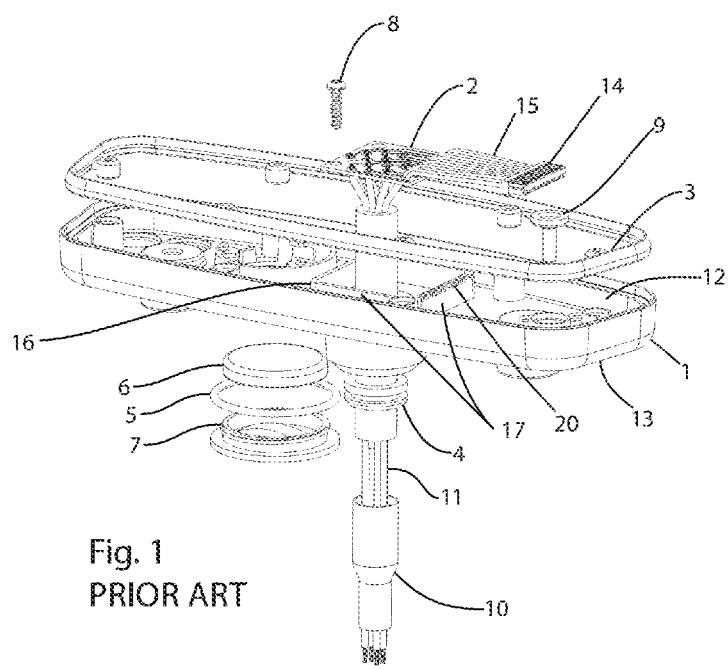
FIG. 1 is an assembly view of components used in a prior art technique for connecting a wire bundle inside of a dashboard.
Figure 2:
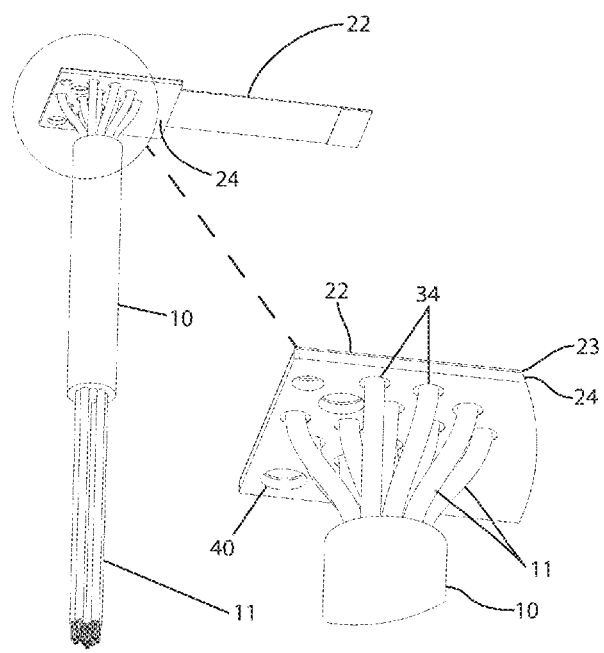
FIG. 2 is a perspective view, with an enlarged detail showing a preferred embodiment of the connection technique of the current invention.
Figure 3:
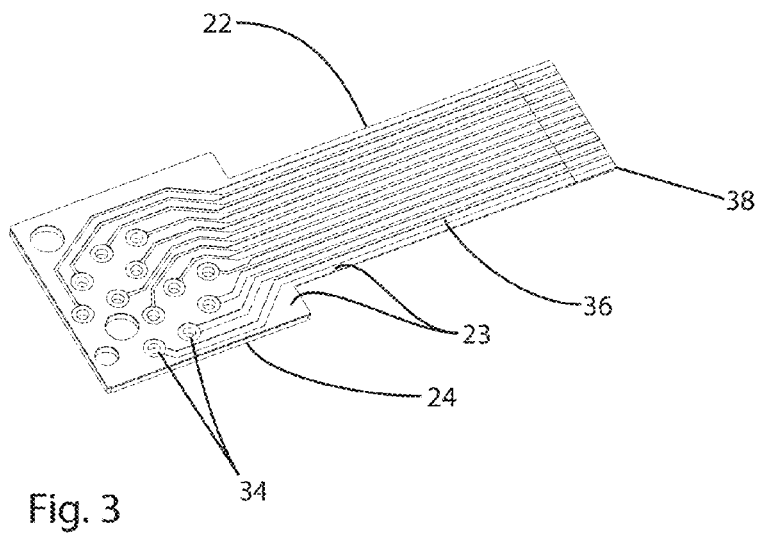
FIG. 3 is a perspective, top view of the conductor assembly component.
Figure 4:
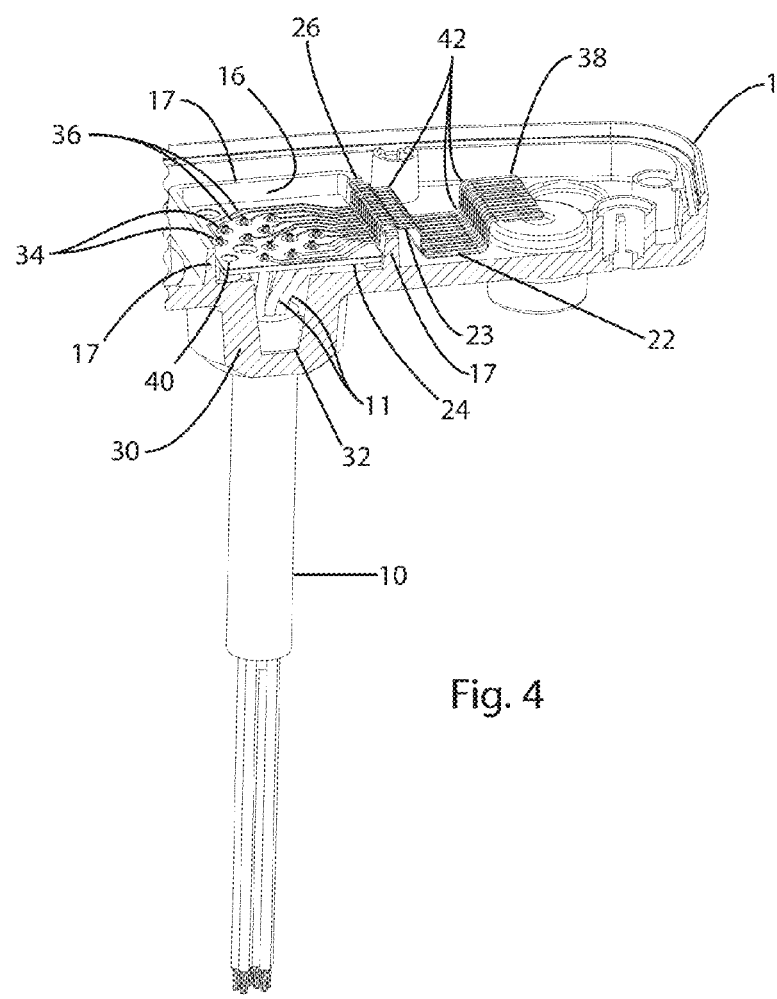
FIG. 4 is a cut-away, top perspective view of a dashboard case with which the preferred connection technique of the current invention is implemented.

FIGS. 2-4 illustrate a preferred embodiment of the present invention. FIG. 2 includes a perspective view and an enlarged detail showing the underside of a conductor assembly 22 component of the present invention. The conductor assembly 22 includes a rigid portion 24 which can be formed of conventional printed circuit board material.

The rigid portion 24 is planar and generally square shaped. As seen in FIG. 4, the rigid portion 24 fits inside of a cubical well 16 that is a compartment formed in the interior 12 of the case 1. The well 16 is defined by four, inwardly projecting thin sidewalls 17 that define the cubical volume within which the rigid portion 24 is seated. The back of the dashboard case defines a protruding cylinder 30 that includes a bore or opening 32 through which the sheath 10 of the wire bundle extends.

As best shown in FIG. 4 and the detail view of FIG. 2, the individual wires 11 of the wire bundle terminate at the underside of the rigid portion 24 of the conductor assembly 22 (FIG. 2). The exposed terminus of each wire 11 passes into a through-hole in the conductor assembly 22 and is soldered to a flanged, conductive sleeve 34 that lines the hole to thus electrically connect the wires 11 with conductive traces 36 (FIG. 4) that are printed on the upper surface of a flexible portion 23 of the conductor assembly.

The flexible portion 23 of the conductor assembly 22 is preferably a flexible plastic substrate having the conductive traces 36 printed thereon. The flexible portion 23 is, like the rigid portion 24, planar in the sense that it is a thin, ribbon-like member having flat upper and lower surfaces. In this embodiment, the flexible portion 23 overlays and is bonded to the rigid portion 24. At one edge of the rigid portion 24, the flexible portion 23 extends away from the rigid portion to a remote end 38 (FIG. 3) that is configured for attachment to the main circuit board of the dashboard.

With reference to FIG. 4, the thin, ribbon-like flexible portion 23 of the conductor assembly is a unitary element, the bending behavior of which is readily controlled (as opposed to the unpredictable, individualized buckling of the several, separate internal wires 15 as discussed above). The flexible portion 23 most readily bends in a direction transverse to its long axis, such as shown at bends 42 in FIG. 4. Problematic sideways buckling or bending (as discussed above) of the flexible portion is thus quite unlikely during the assembly process. Importantly, the combination of the relatively low mass of the flexible portion 23 (as compared to that of the prior art internal wires 15) and the elimination of soldered internal-wire-to-PCB connections effectively eliminates the damaging vibration problem of the prior art.

Moreover, the composition of the flexible portion is such that it holds its shape once bent. This feature thus enables the flexible portion 23 to be bent at specific locations before or during assembly (such as bends 42 in FIG. 4) so that once connected, the flexible portion 23 will readily assume a predicted location within the case. For instance, the controlled location of the bends 42 shown in FIG. 4 results in the formation of a predictably sized and located trough-like volume into which volume other internal components can located within the compact dashboard case 1.

The flexible portion 23 conforms to the shape of a sidewall 17 of the well and extends across a flat, smooth upper edge of a sidewall 17. That is, unlike the prior art, the flat upper edge of the wall 17 over which the flexible portion 23 passes has no grooves or other irregularities that might provide gaps between the flexible portion 23 and wall 17, which gaps could enable moisture that may enter the well to penetrate outside of the well 16 and to the main circuit board as described above with respect to the prior art.

Once the flexible portion 23 of the conductor assembly 22 is properly located as shown in FIG. 4, fasteners that extend through holes 40 provided through the conductor assembly 22 are used to anchor an end of the conductor assembly (that is, the rigid portion 24 and overlying part of the flexible portion 23) to the interior of the well 16. A square flat cover plate (not shown) that conforms to the shape of the well 16 is then secured over the upper edges of the well sidewalls 17 to enclose the well, which is filled with epoxy to seal the well and provide strain relief to the wire junctions.

It is noteworthy that the planar flexible portion 23 thus passes between the substantially flat, opposed surfaces of the sidewall 17 and cover plate, thereby allowing the flexible portion to extend from the well without creating any gaps for enabling moisture to move out of the well in the event that the epoxy seal fails or is damaged in a manner that allows outside moisture to enter the well.

While the foregoing description was made in the context of a preferred embodiment, it is contemplated that modifications to this embodiment may be made without departure from the invention as claimed.

The invention claimed is:

1. A method of conducting signals from several signal-carrying wires to a circuit member that is mounted within the interior of a sealed case, wherein the wires originate from outside the case, the method comprising the steps of:
   connecting termini of the wires to a rigid portion of a conductor assembly, the conductor assembly comprising the rigid portion as well as a planar flexible portion that extends from the rigid portion to a remote end of the flexible portion that is connectable the circuit member;
   seating the rigid portion within an enclosable compartment within the case interior;
   extending from the compartment the flexible portion to enable connection of the remote end to the circuit member, thereby to enable the signals to be conducted from termini of the wires to the circuit member; and
   sealing the rigid portion within the compartment of the conductor assembly.

2. The method of claim 1 wherein the sealing step includes enclosing the compartment with a cover plate.

3. The method of claim 2 wherein the enclosing step includes extending the flexible portion of the conductor assembly out of the compartment.

4. The method of claim 3 wherein the enclosing step further includes extending the flexible portion of the conductor assembly between substantially flat opposed surfaces of the compartment and the cover plate.

5. The method of claim 1 including the step of conducting the signals from a junction of each wire terminus and the rigid portion to the remote end of the flexible portion via a continuous conductor.

6. The method of claim 1 wherein the flexible portion is elongated and has a long axis, and including the step of bending the flexible portion as a unitary element transverse to its long axis.

7. The method of claim 6 including the step of sizing and bending the flexible portion to form a trough-like volume between the compartment and the remote end.

8. An apparatus for conducting signals from several signal-carrying, bundled wires to a circuit member inside of a sealed case, wherein the wires originate from outside the case, the apparatus comprising:
   a case having the circuit member mounted to an interior of the case;
   an enclosed compartment within the case interior, the compartment being enclosed by a cover member that abuts sidewalls of the compartment including an opening to outside of the case interior for receiving an end of the wire bundle;

a conductor assembly having a rigid portion as well as a planar flexible portion, the flexible portion extending from the rigid portion to a remote end of the flexible portion, the conductor assembly arranged with the rigid portion sealed within the compartment and the flexible portion extending between the cover member and an abutting sidewall.

9. The assembly of claim 8 wherein the planar flexible portion extends between flat opposed surfaces of the cover member and the abutting sidewall.

10. The assembly of claim 9 wherein the sidewalls of the compartment are flat at the edges where cover member abuts the sidewalls.

11. The apparatus of claim 8 wherein the conductor assembly includes junctions on the rigid portion joining the terminus of each wire to the rigid portion, and a continuous conductor extending from each junction to the remote end of the flexible portion thereby to conduct the signals from a junction to the remote end of the flexible portion via the continuous conductor.

12. The apparatus of claim 8 wherein the flexible portion is elongated and has a long axis, and wherein the flexible portion is a unitary element that is bent transverse to its long axis.

13. The apparatus of claim 8 wherein the flexible portion is sized and bent to form a trough-like volume between the compartment and the remote end.

\* \* \* \* \*